US010754368B1

(12) United States Patent
Chopra et al.

(10) Patent No.: US 10,754,368 B1
(45) Date of Patent: Aug. 25, 2020

(54) METHOD AND SYSTEM FOR LOAD BALANCING BACKUP RESOURCES

(71) Applicant: EMC IP Holding Company LLC, Hopkinton, MA (US)

(72) Inventors: Shelesh Chopra, Bangalore (IN); Vladimir Mandic, San Jose, CA (US); Gururaj Kulkarni, Bangalore (IN)

(73) Assignee: EMC IP Holding Company LLC, Hopkinton, MA (US)

( * ) Notice: Subject to any disclaimer, the term of this patent is extended or adjusted under 35 U.S.C. 154(b) by 82 days.

(21) Appl. No.: 15/795,914

(22) Filed: Oct. 27, 2017

(51) Int. Cl.
*H03H 7/42* (2006.01)
*G05F 1/66* (2006.01)
*H04L 12/841* (2013.01)
*H04H 20/42* (2008.01)

(52) U.S. Cl.
CPC ............. *G05F 1/66* (2013.01); *H03H 7/42* (2013.01); *H04H 20/42* (2013.01); *H04L 47/28* (2013.01)

(58) Field of Classification Search
CPC .... G06F 8/65; G06F 11/1482; G06F 11/1451; G06F 11/1458; G06F 16/00; G06F 16/2308; G06F 16/2343; G06F 16/27; G06F 16/2471; G06F 16/2453; G06F 16/2365; G06F 11/202; G06F 11/2025; G06F 11/2051; G06F 9/5088; G06F 11/2035; G06F 11/2023; G06F 11/2041; G06F 11/2046; G06F 11/3433; G06F 11/1461; G06F 11/1466; G06F 11/1446; G06F 11/1448; H04W 28/085; H04L 47/803; H04L 47/805; H04L 47/70
See application file for complete search history.

(56) References Cited

U.S. PATENT DOCUMENTS

| 5,493,689 | A  | 2/1996  | Waclawsky et al. |
|-----------|----|---------|------------------|
| 5,606,693 | A  | 2/1997  | Nilsen et al.    |
| 5,668,986 | A  | 9/1997  | Nilsen et al.    |
| 6,298,451 | B1 | 10/2001 | Lin              |
| 6,421,317 | B1 | 7/2002  | Denecheau et al. |
| 6,665,812 | B1 | 12/2003 | Blumenau et al.  |
| 6,826,711 | B2 | 11/2004 | Moulton et al.   |
| 7,246,207 | B2 | 7/2007  | Kottomtharayil et al. |

(Continued)

FOREIGN PATENT DOCUMENTS

EP        2677721 A1    12/2013

OTHER PUBLICATIONS

"Defenders of the Virtual World"; EMC Corporation, EMC Backup, Recovery & Archive Solutions, Backup Recovery Systems Division; Jun. 7, 2012 (59 pages).

(Continued)

*Primary Examiner* — Aftab N. Khan
(74) *Attorney, Agent, or Firm* — Chamberlain, Hrdlicka, White, Williams & Aughtry

(57) ABSTRACT

A method for load balancing backup resources of a backup resource pool includes obtaining status information for a plurality of backup resources of the backup resource pool. The method includes, while an aggregate load state of the backup pool is not overloaded, making a first determination that a first backup resource of the plurality of backup resources has a load state that is overloaded based on the status information and a load policy. The method includes, in response to the first determination, adding a new backup resource to the backup pool.

19 Claims, 8 Drawing Sheets

(56) References Cited

U.S. PATENT DOCUMENTS

| | | | |
|---|---|---|---|
| 7,263,529 B2 | 8/2007 | Cordery et al. | |
| 7,302,450 B2 | 11/2007 | Benedetti et al. | |
| 7,315,923 B2 | 1/2008 | Retnamma et al. | |
| 7,343,453 B2 | 3/2008 | Prahlad et al. | |
| 7,346,686 B2 | 3/2008 | Albert et al. | |
| 7,664,847 B2 | 2/2010 | Colrain et al. | |
| 7,954,143 B2 | 5/2011 | Aaron | |
| 8,156,086 B2 | 4/2012 | Lu et al. | |
| 8,156,502 B1 | 4/2012 | Blanding | |
| 8,209,696 B2 | 6/2012 | Ferguson et al. | |
| 8,286,174 B1 | 10/2012 | Schmidt et al. | |
| 8,375,396 B2 | 2/2013 | Pooni et al. | |
| 8,387,054 B1 | 2/2013 | Zeis et al. | |
| 8,412,900 B1 | 4/2013 | Sano et al. | |
| 8,458,210 B2 | 6/2013 | Arifuddin et al. | |
| 8,549,247 B2 | 10/2013 | Satoyama et al. | |
| 8,578,120 B2 | 11/2013 | Attarde et al. | |
| 8,695,012 B2 | 4/2014 | Kanso et al. | |
| 8,782,256 B2 | 7/2014 | Dec et al. | |
| 8,965,921 B2 | 2/2015 | Gajic | |
| 8,972,326 B2 | 3/2015 | Prathaban et al. | |
| 9,069,482 B1 | 6/2015 | Chopra et al. | |
| 9,141,435 B2 | 9/2015 | Wein | |
| 9,172,750 B2 | 10/2015 | Bulkowski et al. | |
| 9,235,579 B1 | 1/2016 | Suarez | |
| 9,372,637 B1 | 6/2016 | Alatorre et al. | |
| 9,489,270 B2 | 11/2016 | Anglin et al. | |
| 9,519,432 B1* | 12/2016 | Haustein | G06F 11/1458 |
| 9,672,116 B1 | 6/2017 | Chopra et al. | |
| 9,838,332 B1 | 12/2017 | Smith | |
| 10,013,189 B1 | 7/2018 | Yang et al. | |
| 10,250,488 B2 | 4/2019 | Cropper et al. | |
| 10,412,022 B1 | 9/2019 | Tang et al. | |
| 10,423,459 B1 | 9/2019 | Jacques de Kadt et al. | |
| 2001/0054095 A1* | 12/2001 | Kampe | G06F 11/202 709/223 |
| 2003/0224781 A1* | 12/2003 | Milford | H04L 1/16 455/426.1 |
| 2004/0153708 A1* | 8/2004 | Joshi | G06F 9/5088 714/47.2 |
| 2004/0186844 A1 | 9/2004 | Muhlestein | |
| 2005/0010727 A1 | 1/2005 | Cuomo et al. | |
| 2005/0033818 A1 | 2/2005 | Jardin | |
| 2005/0149940 A1* | 7/2005 | Calinescu | G06F 9/5061 718/104 |
| 2006/0101224 A1 | 5/2006 | Shah et al. | |
| 2007/0180314 A1* | 8/2007 | Kawashima | G06F 11/2023 714/15 |
| 2007/0198797 A1 | 8/2007 | Kavuri et al. | |
| 2007/0220319 A1 | 9/2007 | Desai | |
| 2008/0115190 A1 | 5/2008 | Aaron | |
| 2008/0140960 A1 | 6/2008 | Basler et al. | |
| 2008/0222297 A1 | 9/2008 | Mengerink | |
| 2009/0144388 A1 | 6/2009 | Gross et al. | |
| 2009/0164832 A1* | 6/2009 | Kanso | G06F 8/65 714/1 |
| 2010/0017445 A1* | 1/2010 | Kobayashi | G06F 11/1461 707/E17.01 |
| 2011/0022812 A1 | 1/2011 | van der Linden et al. | |
| 2011/0153941 A1 | 6/2011 | Spatscheck et al. | |
| 2011/0178831 A1* | 7/2011 | Ravichandran | G06Q 10/06 705/7.11 |
| 2012/0059934 A1 | 3/2012 | Rafiq et al. | |
| 2012/0117028 A1* | 5/2012 | Gold | G06F 11/1451 707/640 |
| 2012/0204187 A1 | 8/2012 | Breiter et al. | |
| 2012/0254443 A1 | 10/2012 | Ueda | |
| 2014/0025796 A1 | 1/2014 | Vibhor | |
| 2014/0089511 A1 | 3/2014 | Mclean | |
| 2014/0211698 A1* | 7/2014 | Aguirre | H04W 28/085 370/329 |
| 2014/0297611 A1* | 10/2014 | Abbour | G06F 16/2343 707/703 |
| 2014/0304412 A1 | 10/2014 | Prakash et al. | |
| 2014/0331078 A1 | 11/2014 | Cohen | |
| 2014/0337285 A1 | 11/2014 | Gokhale et al. | |
| 2015/0067353 A1 | 3/2015 | Hui | |
| 2015/0067354 A1 | 3/2015 | Hui | |
| 2015/0286519 A1 | 10/2015 | Huang et al. | |
| 2016/0092311 A1* | 3/2016 | Bushman | G06F 11/1446 707/646 |
| 2016/0162369 A1 | 6/2016 | Ahn et al. | |
| 2016/0378552 A1 | 12/2016 | Taylor et al. | |
| 2016/0378614 A1 | 12/2016 | Thanasekaran | |
| 2017/0371562 A1 | 12/2017 | Delaney et al. | |

OTHER PUBLICATIONS

"EMC® NetWorker® Module for Microsoft for Exchange Server VSS, Release 8.2, User Guide"; EMC Corporation; 2014 (150 pages).

Extended European Search Report issued in corresponding Application No. EP19169660.8, dated Aug. 30, 2019. (8 pages).

Slota et al.; "Prediction and Load Balancing System for Distributed Storage"; Scalable Computing: Practice and Experience (SCPE); vol. 11, No. 2; pp. 121-130; 2010.

* cited by examiner

METHOD AND SYSTEM FOR LOAD BALANCING BACKUP RESOURCES

BACKGROUND

Computing devices or processes generate, use, and store data. In order to preserve data, computing devices or processes may routinely schedule backup and archiving operations of its stored data. A backup operation may either be a full backup session, where every file is copied to archive media, or it may be an incremental backup session, where less than every file is copied. Full backup sessions may be periodically scheduled, and incremental backups may be scheduled between each full backup. Since an incremental backup only includes the changes to the file system since the previous backup session, it may take less time than a full backup.

SUMMARY

In one aspect, a method for load balancing backup resources of a backup resource pool in accordance with one or more embodiments of the invention includes obtaining status information for a number of backup resources of the backup resource pool; while an aggregate load state of the backup pool is not overloaded, making a first determination that a first backup resource of the number of backup resources has a load state that is overloaded based on the status information and a load policy; and in response to the first determination, adding a new backup resource to the backup pool.

In one aspect, a non-transitory computer readable medium in accordance with one or more embodiments of the invention includes computer readable program code, which when executed by a computer processor enables the computer processor to perform a method for load balancing backup resources of a backup resource pool, the method includes obtaining status information for a number of backup resources of the backup resource pool; while an aggregate load state of the backup pool is not overloaded, making a first determination that a first backup resource of the number of backup resources has a load state that is overloaded based on the status information and a load policy; and in response to the first determination, adding a new backup resource to the backup pool.

In one aspect, a system in accordance with one or more embodiments of the invention includes a client, a backup pool, and a resource controller. The backup pool includes a number of backup resources. The resource controller is in communication with the client and the backup pool. The resource controller includes a processor. The processor obtains status information for the number of backup resources of the backup resource pool; while an aggregate load state of the backup pool is not overloaded, the processor makes a determination that a first backup resource of the number of backup resources has a load state that is overloaded based on the status information and a load policy; and in response to the determination, the processor add a new backup resource to the backup pool.

DETAILED DESCRIPTION

Figure 1:
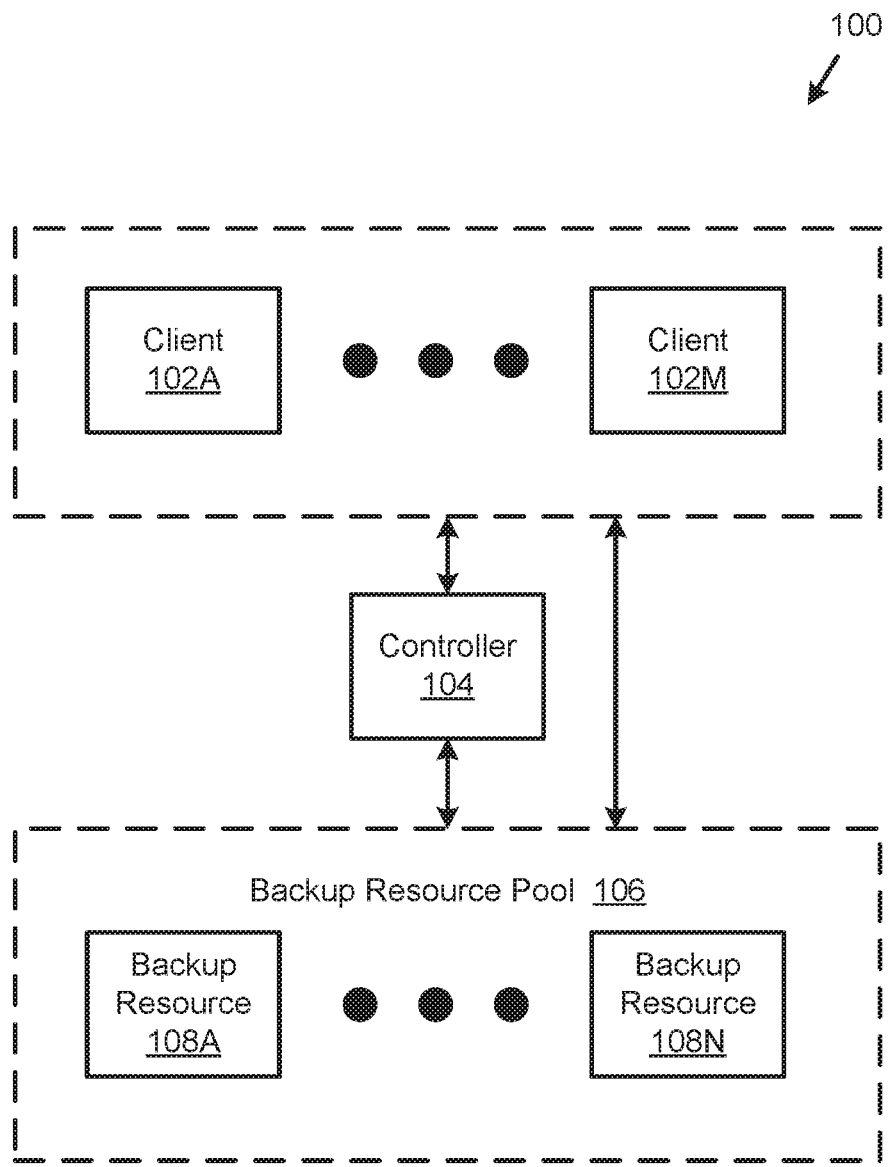
FIG. 1 shows a diagram of a system for assigning clients to backup resources in a backup pool in accordance with one or more embodiments of the invention.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description In the following description of FIGS. 1-8, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to methods and systems for providing file storage and/or backup/archive services to clients. More specifically, embodiments of the technology relate to monitoring the client load of backup resources and taking measures to mitigate the number of backup resources that exhibit an overloaded load state. As used herein, load state or client load refers to the amount of work the backup resource performs to provide services to its assigned clients. This work may be measured by load parameters, such as CPU or memory utilization, as further described herein. The background services performed by the backup resources in a backup resource pool (e.g., data deduplication, compression, incremental storage, etc.) are resource intensive, and the performance of the background services directly impacts the service experienced by the clients (e.g., file transfer rate, latency, etc.) assigned to the backup resources. Periodically monitoring the client load of the backup resources and adding an additional backup resource to the backup resource pool when a backup resource is overloaded can alleviate resource bottlenecks (such as abnormally long read/write times, deduplication times, compression times, response times, etc.) in the interaction between the clients and backup resources. An additional backup resource may also increase the client capacity of the backup resource pool.

Embodiments of the technology also relate to monitoring the client load and removing a backup resource that exhibits an underloaded state. Backup resources may also be operating in the backup pool in an underloaded state, e.g., essentially running idle with very few clients or no clients. To reduce the operating cost of the backup pool, underloaded backup resources may be shutdown and removed from the backup pool. The clients may also be migrated from the underloaded backup resources to other backup resources.

FIG. 1 shows a diagram of a system in accordance with one or more embodiments of the invention. The system (100) includes clients (102A, 102M), a resource controller (104), and a backup resource pool (106). The backup resource pool (106) includes backup resources (108A, 108N). The system (100) may include any number of clients (102A-102M) or backup resources (108A-108N).

The clients (102A, 102M) are operably connected to both of the resource controller (104) and the backup resource pool (106). The operable connections between the aforementioned components of the system (100) may be implemented using any combination of wired or wireless communication interfaces and/or protocols.

The controller (104) is operably connected to the clients (102A, 102M) and the backup resource pool (106). The operable connections between the aforementioned components of the system (100) may be implemented using any combination of wired or wireless communication interfaces or protocols. Each component of the system (100) is described below.

In one or more embodiments of the invention, the clients (102A, 102M) may store data using the backup resource pool (106). More specifically, the clients (102A, 102M) may store data using a single backup resource (108A, 108N) of the backup resource pool (106). For example, a client may be assigned to a backup resource of the backup resource pool (106). Once assigned, the client may send data to the assigned backup resource for storage. As will be discussed below, the resource controller (104) may assign clients to backup resources.

The data stored by the clients (102A, 102M) via the backup resource pool (106) includes, but is not limited to, text files, image files, audio files, and video files. In one or more embodiments of the invention, the clients (102A, 102M) may utilize the backup resource pool (106) as an external data storage, an archive storage, a media server, and/or a backup storage. An external data storage may be utilized by a client to store any type of data. An archive data storage may be utilized by a client to store copies of important files such as, for example, drafts of documents. A media server may be utilized by a client to store and/or provide media files to which the client has access rights. A backup storage may be utilized by a client to store copies of files stored on a local storage of the client or another computing device.

In one or more embodiments of the invention, the clients (102A, 102M) may be computing devices. The computing devices may be, for example, mobile phones, tablet computers, laptop computers, desktop computers, or servers, see, e.g., the computing device of FIG. 8. The computing devices may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions described in this application and the method illustrated in FIG. 3. The clients (102A, 102M) may be other types of computing devices without departing from the invention.

In one or more embodiments of the invention, the clients (102A, 102M) may be virtual machines, or other virtual entity that utilizes physical computing resources, executing on one or more computing devices. The computing devices may be, for example, mobile phones, tablet computers, laptop computers, desktop computers, cloud computing systems, computing clusters, or servers. The computing devices may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to execute a virtual machines that perform the functions described in this application and the method illustrated in FIG. 3.

In one or more embodiments of the invention, the resource controller (104) may assign clients (102A, 102M) to backup resources (108A, 108N) of the backup pool (106). The resource controller (104) may assign the clients (102A, 102M) in a manner designed to reduce overloading of the backup resources (108A, 108N) of the backup pool (106).

In one or more embodiments of the invention, the resource controller (104) may monitor a load state of the backup resources (108A, 108N). The resource controller (104) may assign clients based on the monitored load state to reduce overloading of the backup resources (108A, 108N).

In one or more embodiments of the invention, the resource controller (104) may add a new backup resource to the backup resource pool based on the monitored load state of the backup resources (108A, 108N). Adding a new backup resource may reduce overloading of the backup resources (108A, 108N) by expanding the quantity of backup resources (108A, 108N) to which clients may be assigned.

Figure 8:
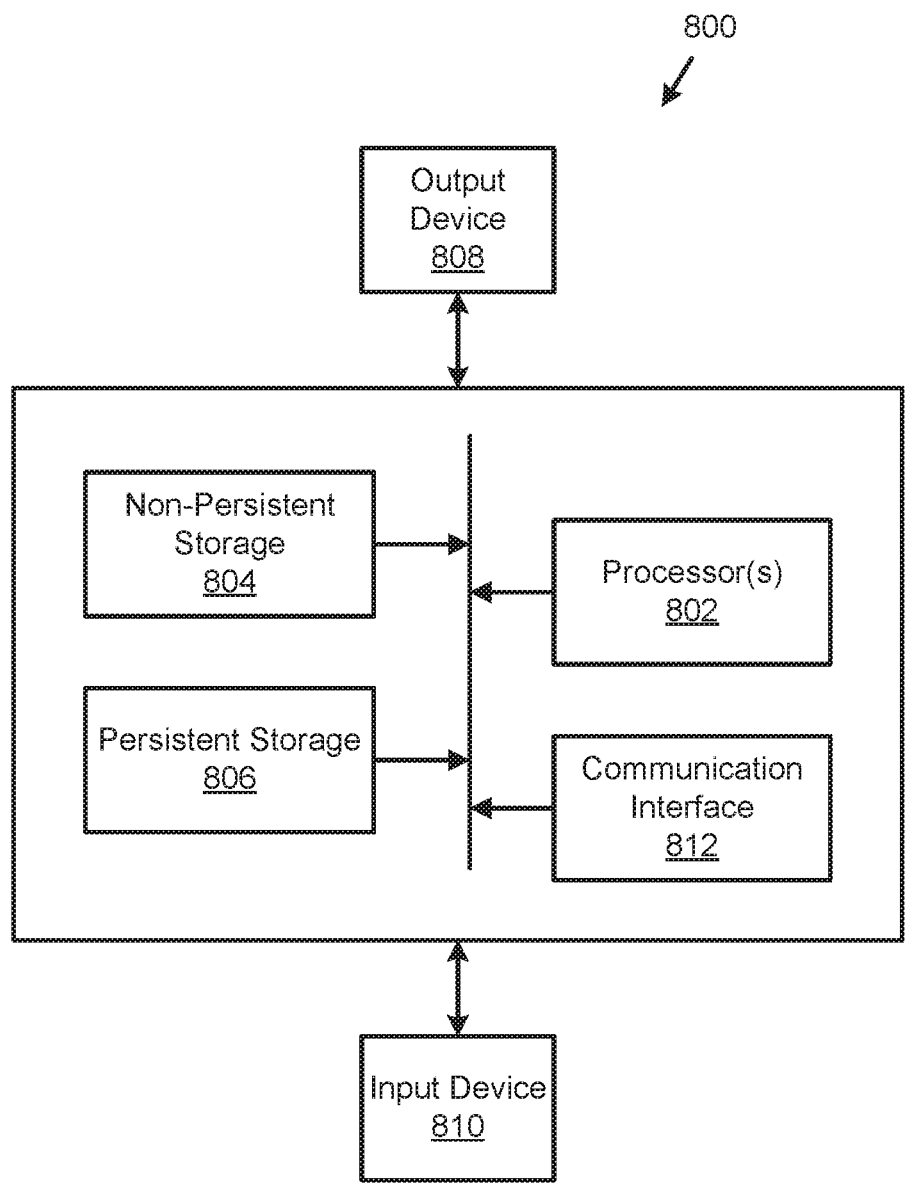
FIG. 8 shows a diagram of a computing device in accordance with one or more embodiments.

In one or more embodiments of the invention, the resource controller (104) may be a computing device, see, e.g., the computing device of FIG. 8. The computing device may be, for example, a mobile phone, tablet computer, laptop computer, desktop computer, cloud computing system, computing cluster, or server. The computing device may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions described in this application and the methods illustrated in FIGS. 4-5. The resource controller (104) may be another type of computing device without departing from the invention.

In one or more embodiments of the invention, the resource controller (104) may be a virtual machine, or other virtual entity that utilizes physical computing resources, executing on one or more computing devices. The computing devices may be, for example, mobile phones, tablet computers, laptop computers, desktop computers, cloud computing systems, computing clusters, or servers. The computing devices may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to execute a virtual machines that perform the functions described in this application and the methods illustrated in FIGS. 4-5.

Figure 4:
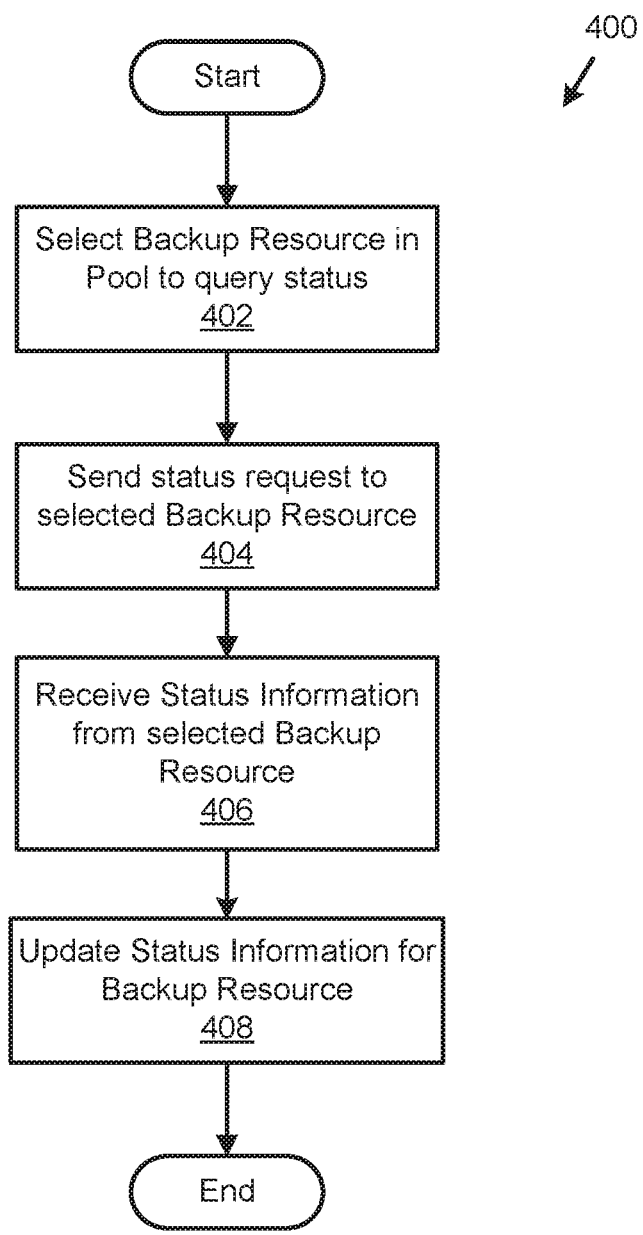
FIG. 4 shows a flowchart for obtaining the status information for a backup resource in accordance with one or more embodiments of the invention.
Figure 5:
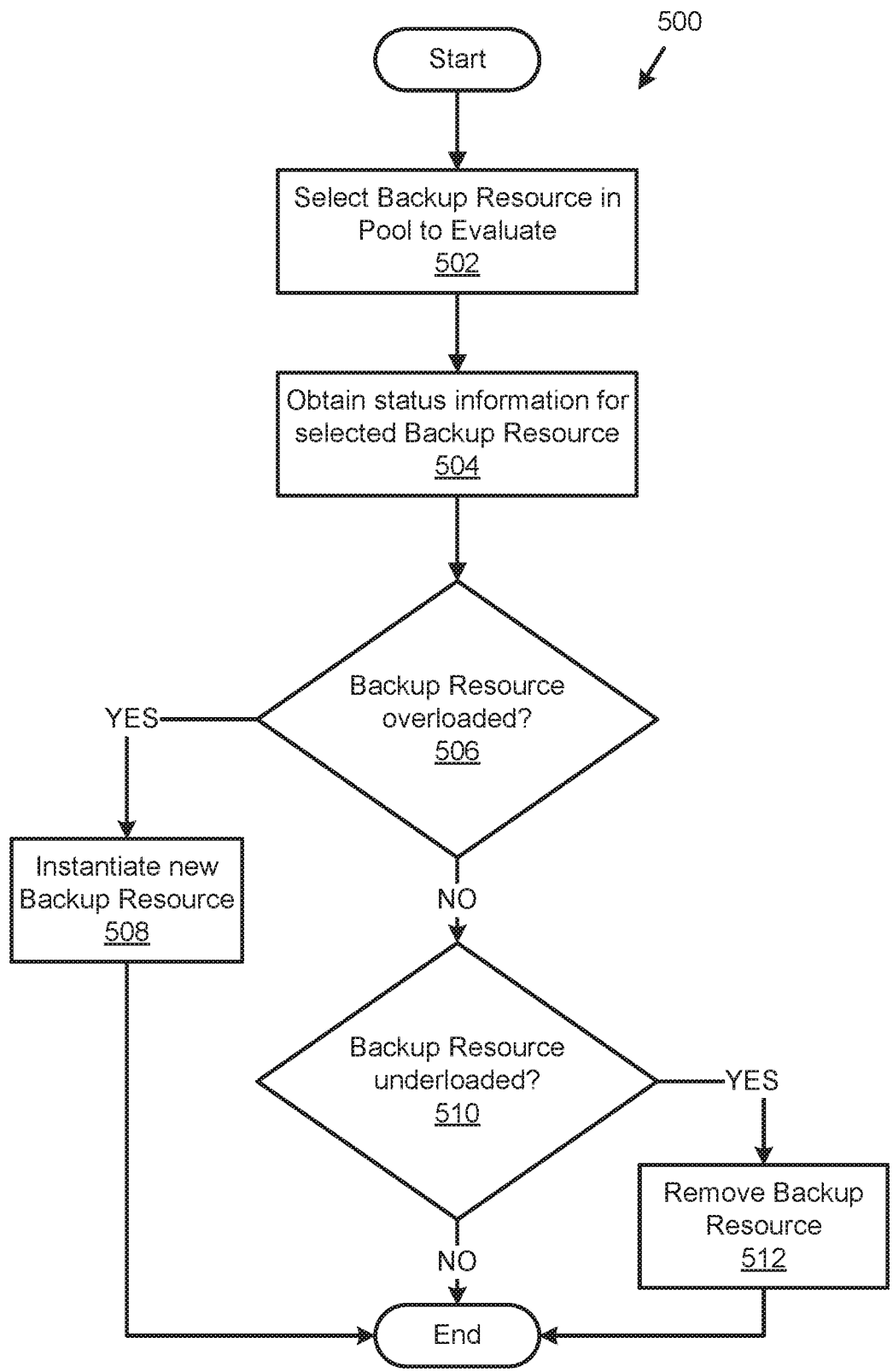
FIG. 5 shows a flowchart for adding a new backup resource to the backup pool in accordance with one or more embodiments of the invention.

In one or more embodiments of the invention, the resource controller (104) includes a status engine, status information, a resource manager, a policy store, and an assignment engine to provide the aforementioned functionality and/or assist in performing the methods illustrated in FIGS. 4-5. For additional details regarding the aforementioned components and the operation of the resource controller (104), See FIG. 2.

In one or more embodiments of the invention, the backup resource pool (106) includes one or more backup resources (108A, 108N). The backup resources (I 108A, 108N) may store and/or provide data from/to the clients (I 102A, 102M). The backup resources (108A, 108N) may store/provide data in connection with data storage, backup, or archive services to the clients (102A, 102M). The backup resources (108A, 108N) may store/provide data in connection with other type of services to the clients without departing from the invention.

In one or more embodiments of the invention, the backup resources (108A, 108N) may notify the controller (104, FIG. 1) of a load state of the backup resources to assist the controller (104, FIG. 1) when assigning clients to backup resources. The load state may indicate whether/to what extent the backup resource may take on new clients without becoming overloaded. In one or more embodiments of the invention, the backup resources (108A, 108N) may notify the controller (104, FIG. 1) by sending status information indicating the load state of the respective backup resource. For additional details regarding load state and actions that a controller may take, See FIG. 2.

In one or more embodiments of the invention, the backup resources (108A, 108N) may be computing devices, see, e.g., the computing device of FIG. 8. The computing devices may be, for example, mobile phones, tablet computers, laptop computers, desktop computers, cloud computing systems, computing clusters, or servers. The computing device may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions described in this application. The backup resources (108A, 108N) may be other types of computing devices without departing from the invention.

In one or more embodiments of the invention, the backup resources (108A, 108N) may be a virtual machines, or other virtual entities that utilizes physical computing resources, executing on one or more computing devices. The computing devices may be, for example, mobile phones, tablet computers, laptop computers, desktop computers, cloud computing systems, computing clusters, or servers. The computing devices may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to execute a virtual machines that perform the functions described in this application.

In one or more embodiments of the invention, a backup resource (108) may be a media server, which hosts digital media (e.g., digital videos, audio, or picture files) and provides the clients (102A, 102M) with on-demand access to the digital media. In one or more embodiments of the invention, a backup resource (108) may be, but is not limited to, a: (i) deduplication system, which include functionality to deduplicate all or a portion of the files received from the client prior to storing the files (or portions thereof) in the persistent storage, (ii) deduplication system (as described in (i)), which is implemented as virtual appliances or machines on a computing device, (iii) cloud-based storage system, where the client issues read and write requests to a cloud service, where the cloud service processes the requests to store files (or portions thereof) on a remotely located persistent storage (which may or may not be distributed) or to retrieve files (or portions thereof) from a remotely located persistent storage (which may or may not be distributed), (iv) cloud-based storage system (as described in (iii)), which includes functionality to deduplicate the file (or a portion thereof) prior to storing the file, (v) storage system (which may be implemented as virtual applications) which do not deduplicate the files (or portions thereof) prior to storing the files in the persistent storage.

In one or more embodiments of the invention, the backup resource pool (106) may include backup resources of varying types. A type of a backup resources may be defined based on the type of services that it offers to a client and/or the hardware resources available to the backup resources. For example, the backup resource (108A) may provide deduplication services to clients while backup resource (108N) data archival services. In another example, the backup resource (108A) may include eight processors sufficient to provide services to ten clients while backup resource (108N) may include four processors sufficient to provide services to five clients.

In one or more embodiments of the invention, the backup resources of the backup pool (106) are dynamically adjusted. More specifically, backup resources may be added to or removed from the backup pool (106) at any point in time. In one or more embodiments of the invention, a type of backup resource may be added to the backup pool (106) based on a type of service requested by a client. For example, backup resources that have a large amount of solid state storage may be added to the backup resource pool (106) in response to clients requesting services that require fast access to data stored in the backup resources.

Figure 2:
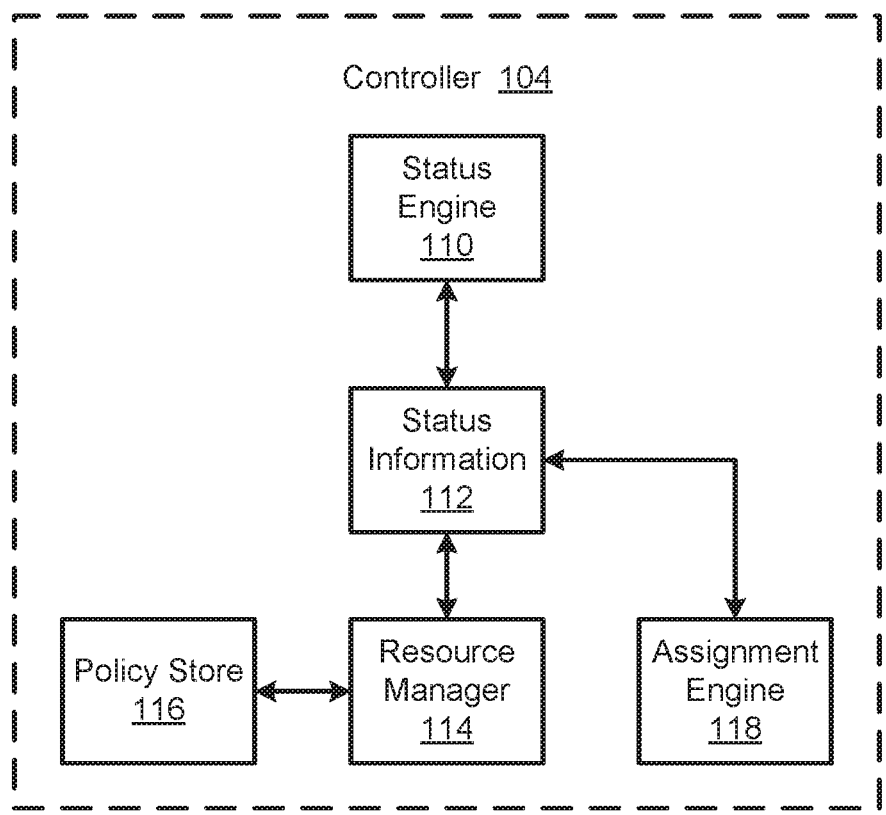
FIG. 2 shows a block diagram of a resource controller in accordance with one or more embodiments of the invention.

FIG. 2 shows a diagram of a resource controller (104) in accordance with one or more embodiments of the invention. The resource controller (104) may be employed to determine which backup resources may receive a client assignment based on the load state of the backup resources in accordance with one or more embodiments of the invention. The resource controller (104) includes a status engine (110), status information (112), a resource manager (114), a policy store (116), and an assignment engine (118). Each component of the resource controller (104) is described below.

In one or more embodiments of the invention, the status engine (110) may be one or more processes or computing devices that include one or more processors (not shown) and memory (not shown). The status engine (110) provides functionality to obtain the status information (112) from the backup resources (108A, 108N). For instance, the status engine (110) may continuously update the status information (112) of the backup resources (108A, 108N) and store the status information for evaluation by the assignment engine (118) and/or the resource manager (114) as further described herein with respect to FIG. 4.

The status engine (110) may update the stored status information (112) on a static polling frequency, a dynamically allocated polling frequency, or in response to the occurrence of an event, such as receipt of a backup resource assignment request as further described herein. For instance, the status engine (110) may update the status information less frequently during periods of the day that experience relatively low client loads, but may update the status information more frequently during periods of the day that experience relatively high client loads. The status engine (110) may update the status information after a fixed period of time or upon receipt of a backup resource assignment request from a client. The status engine (110) is operably connected to the status information (112), the backup resource pool (106) of FIG. 1, and the backup resources (108A, 108N) of FIG. 1.

The status information (112) may be a data structure, including but not limited to a database, table, or an associative array, which stores various load parameters indicating the client load of one or more backup resources. The status information (112) includes one or more load parameters that are indicative of when a backup resource is overloaded or underloaded. The load parameters may indicate processor utilization, processor load, the number of processes running, memory utilization (virtual, physical, or both), data storage utilization, data read/write speeds, network utilization, power utilization, component temperature (e.g., processor temperature or memory temperature), the number of clients assigned to the backup resource, any other suitable parameter for assessing the load or performance of the backup resource, or any combination thereof. The status information (112) may be a condition or state of the process interacting with the clients (e.g., a file storage or backup process), the underlying computing device running the process interacting with the clients, or both. The status information (112) may also include an identifier for the backup resource associated with the status information, a time stamp of when the load parameter was obtained, and the values for the load parameter(s) obtained.

Utilization may refer to the amount of computing resources used relative to the total amount of computing resources available. For instance, a value of 50% memory utilization indicates that half the memory resources are being used on a backup resource. Likewise, a value of 20% CPU utilization refers to 20% of the CPU resources being used on a backup resource. As used herein, the processor load may refer to a weighted average of the number processes that are in a runnable or uninterruptable state. A process in a runnable state is either using the processor or waiting to use the processor.

The load parameter may specify a rate of use of a computing resource (e.g., processor cycles, transitory memory space, network communication bandwidth, and disk input-output) of a backup resource. For instance, the rate of use of a computing resource may include a processor utilization, a memory utilization, a network bandwidth utilization, and persistent storage utilization, or a combination thereof. The load parameter may specify a concurrency of use of a backup resource including but not limited to a cardinality of a clients that utilize the backup resource or a cardinality of processes executing on the backup resource. The load parameter may also specify a condition of a backup resource including a power consumption of the backup resource or a temperature of a component of the backup resource.

Table 1 below provides non-limiting examples of status information that may be obtained by the status engine (112) for two backup resources (108A, 108B):

TABLE 1

Example Status Information

| Backup Resource | Query Time | No. of Clients | CPU Utilization | Memory Utilization |
|---|---|---|---|---|
| 108A | 1506696276 | 13 | 10% | 14% |
| 108B | 1506696276 | 10 | 20% | 25% |

As shown, Table 1 includes columns for the backup resource identifier, the time at which the status information was obtained, the number of clients assigned to the backup resource, the CPU utilization of the backup resource, and the memory utilization of the backup resource. In this example, the query time is represented as epoch time, but the query time may also be used in any other format. It should be appreciated that status information may contain any number of load parameters or load states of the respective backup resources.

The status information (112) may be stored in memory and may be accessible to the status engine (110), the resource manager (114), and the assignment engine (118). More specifically, the status information (112) may be operably connected to these components of the resource controller (104).

In one or more embodiments of the invention, the resource manager (114) may be one or more processes or computing devices that include one or more processors (not shown) and memory (not shown). The resource manager (114) assesses the client load of the backup resources according to one or more load policies in the policy store (116) and the status information (112). Upon determining the client load, the resource manager (114) may instantiate a new backup resource in the backup pool, remove a backup resource from the backup pool, or continue to monitor the client load.

The resource manager (114) may evaluate the client load of the backup resources based on a polling frequency or the occurrence of an event, such as receipt of the backup resource assignment request from a client. The resource manager (114) may monitor the status information (112) for any updated information and trigger evaluation of the client load of a backup resource based on the update. The resource manager (114) may be operably connected to the status information (112), the policy store (116), and the backup resources (108A, 108N) of FIG. 1. The resource manager (114) may update the policy store (116), the status information (112), or both.

In one or more embodiments of the invention, the policy store (116) may be a data structure which stores predetermined or dynamically generated load polices for assessing the client load of the backup resources (108A, 108N) of FIG. 1. The policy store (116) may be, for example, a database, table, or an associative array of one or more load policies that are used to identify when a backup resource has a load state that is overloaded or underloaded. A load policy may specify a load state of a backup resource based on the status information. The load policy may specify a function of a degree of utilization of a backup resource or more than one backup resource. This function may specify that a backup resource is overloaded when the degree of utilization of the backup resource exceeds a threshold. In the case of evaluating an aggregate load state of the backup resource pool, the function may specify that the backup resources are overloaded when an aggregate degree of utilization of the backup resources exceeds a threshold. An aggregate load policy may include an aggregate load state that specifies that the backup resources are overloaded when an aggregate degree of utilization of the backup resources exceeds a threshold.

A degree of utilization may indicate the extent a computing resource is being used or a measure of the performance of the computing resource. For instance, the value of a load parameter may represent a degree of utilization of the backup resource. An aggregate degree of utilization may be the gross value, average value, mean value, median value, or a statistical measure of a given load parameter exhibited across the backup resources. The aggregate degree of utilization as a gross value may be the total number of clients assigned to the backup resources or the total number of backup resources assigned in the backup resource pool. The aggregate degree of utilization may also be the total amount of computing resources used by the backup resources relative to the total amount available.

The load policy may include a load state that specifies that a backup resource is overloaded when a load parameter of the status information for the selected backup resource exceeds a threshold for that load parameter. For instance, the load policy may specify a load state that the backup resource is overloaded when the CPU utilization or memory utilization exceeds a given threshold. Likewise, to identify an underloaded state, the load policy may include a load state that a backup resource is underloaded when a load parameter of the status information for the selected backup resource is below a threshold for that load parameter.

Table 2 below provides examples of load policies that may be used by the resource manager (114) to identify an overloaded or underloaded backup resource:

TABLE 2

Example Load Policies

| Policy Identifier | No. of Clients | CPU Utilization | Memory Utilization |
|---|---|---|---|
| 1 | 50 | 30% | 30% |
| 2 | 25 | 50% | 20% |
| 4 | 3 | 3% | 3% |
| 5 | 5 | 5% | 5% |
| 6 | 200 | 55% | 80% |

As shown, Table 2 includes thresholds used to identify when a backup resource is overloaded or underloaded for given load parameters. In Table 2, the policies include thresholds for the number of clients assigned to the backup resource, the CPU utilization, and the memory utilization. It should be appreciated that load policies may contain any number of thresholds for load parameters. The policies also include a policy identifier, which may be used by the resource manager (114) to select a given policy for evaluation. The first and second load policies may be used to identify an overloaded backup resource and the next two load policies may be used to identify an underloaded backup resource. More specifically, a backup resource may be overloaded if the load parameter exceeds the given threshold for that parameter; whereas a backup resource may be underloaded if the load parameter is below the given threshold for that parameter.

In Table 2, the last load policy may be used to evaluate the aggregate degree of utilization of the backup resources. For instance, maximum number of clients assigned to the backup resources in the backup resource pool is set as 200 clients. The aggregate thresholds for CPU and memory utilization may be thresholds for the gross, mean, or median values of utilization for the backup resources. More specifically, the backup resources may not be in compliance with the CPU utilization threshold if the mean CPU utilization of the backup resources exceeds the CPU utilization threshold in the last load policy of Table 2. The resource controller (104) may take corrective measures as further described herein with respect to FIG. 5.

The backup resources may be assigned to the same load policy or different policies. For instance, some backup resources may be assigned to the first policy of Table 2, and other backup resources may be assigned to the second policy of Table 2. The load policies may reflect the characteristics of the components possessed by a given backup resource. For instance, the load policy may be set differently based on the number of processors or storage capacity of a backup resource. The load policy may reflect the functionality (data backup/archive or file storage) that the backup resource is providing to its clients. Different policies may be used at different times of a given time period (e.g., hour, day, week, or month) depending on the client load exhibited by the backup resources. Thresholds for the load policy may be a fixed value or a dynamically allocated value, e.g., a percentage of a moving average, median, or mean.

The policy store (112) may be stored on memory and accessible to the assignment engine (116). More specifically, the policy store (112) may be operably connected to the assignment (116) of the resource controller (104). The assignment engine (118) may alter the policy store (112) at various times to react to the client load exhibited by the backup resources.

Figure 3:
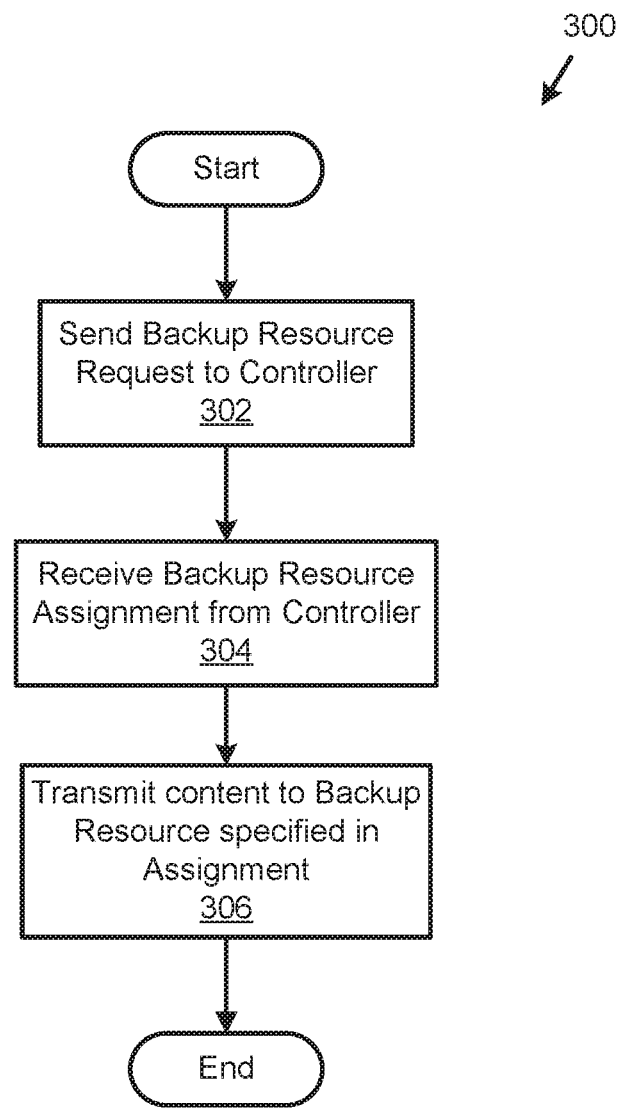
FIG. 3 shows a flowchart for assigning a backup resource to a client in accordance with one or more embodiments of the invention.

In one or more embodiments of the invention, the assignment engine (118) assigns a client to a backup resource in the backup pool as further described herein with respect to FIG. 3. The assignment engine (118) may be one or more processes or computing devices that include one or more processors (not shown) and memory (not shown).

While the various steps in the following flowcharts are presented and described sequentially, one of ordinary skill will appreciate that some or all of the steps may be executed in different orders, may be combined or omitted, and some or all of the steps may be executed in parallel.

FIG. 3 shows a flowchart of a method (300) for storing data in a backup resource.

At block (302), the client sends a backup resource request to the resource controller (104).

In one or more embodiments of the invention, when a client initially accesses the system (100), the client may request assignment of a backup resource to provide services to the client. For example, the client may send the backup resource request on startup, or the backup resource request may be sent when an application on the client is opened or installed on the client. The backup resource request may specify the type of service requested by the client, including backup services or file storage services. The assignment engine (118) may evaluate the request to select an appropriate backup resource for the client.

At block (304), the client receives a backup resource assignment from the resource controller (104).

In one or more embodiments of the invention, upon receiving the assignment request, the assignment engine (118) selects an existing backup resource from the backup resource pool or the backup resources enabled for client assignment.

In one or more embodiments of the invention, the selection of the backup resource employs a round-robin selection process, a priority-based selection process (e.g., based on previous status information obtained from the backup resources, the type of components possessed by a given backup resource, or any suitable priority), a random selection process, any suitable selection method, or a combination thereof. The assignment engine (118) may search the status information (112) to identify the backup resources enabled for assignment and exclude from selection any backup resources that may be disabled for assignment. The backup resource assignment may include a unique identifier for the backup resource selected for the client, including but not limited to a unique label (e.g., a universally unique identifier), a network address, a hardware address, a fully qualified domain name, any other identifier, or a combination thereof.

At block (306), upon receiving the backup resource assignment, the client may begin utilizing the backup resource as a storage device or a backup/archive server.

In one or more embodiments of the invention, the client utilizes the backup resource for the service assigned to the client, such as file storage or backup services. For example, the client may transmit content to the backup resource specified in the assignment message for file storage or as a backup/archive of the content. From the client's perspective, the backup resource may be a storage device or a remote server or process which provides data backup or archive services.

The method may end following block (306).

FIG. 4 shows a flowchart of a method (400) for obtaining the status information from the backup resources (108A, 108N) of FIG. 1.

At block (402), the status engine (110) may select a backup resource in the back pool from which to query status information.

In one or more embodiments of the invention, the selection of the backup resource employs a round-robin selection process, a priority-based selection process (e.g., based on previous status information obtained from the backup resources, the type of components possessed by a given backup resource, or any suitable priority), a random selection process, any suitable selection method, or any combination thereof.

At block (404), the status engine (110) sends a status request to the selected backup resource.

In one or more embodiments of the invention, the status request may be a message, which upon receipt by the backup resource triggers the backup resource to collect status information, which is indicative of its client load. The status request may specify the load parameters to which the status information must contain. This allows the status engine to update particular load parameters at different frequencies or times. The backup resource may also be pre-configured to transmit a given set of load parameters upon receipt of the status request.

At block (406), the status engine (110) receives the status information from the selected backup resource.

In one or more embodiments of the invention, the status information includes the load parameters obtained by the backup resource in response to the status request.

At block (408), the status information (112) for the selected backup resource may be updated with the received status information.

In one or more embodiments of the invention, the status information (112) may be stored in a data structure and used for determining client assignment among the backup resources as described herein.

The method may end following block (408).

The method (400) may be repeated for all or some of the backup resources in the backup pool. The method (400) may be performed serially or in parallel for the backup resources in the backup pool. The method (400) may also be repeated after a set period of time to update the status information. For instance, the status engine (110) may obtain the status information for a backup resource every minute, five minutes, hour, five hours, or any other period of time.

FIG. 5 shows a flowchart of a method (500) for identifying a backup resource that is overloaded or underloaded based on the status information (112) collected in method (400) and a load policy in the policy store (116) of FIG. 2.

At block (502), the resource manager (114) selects a backup resource in the backup pool to evaluate the client load. The selection of the backup resource may employ a round-robin selectin process, a priority-based selection process (e.g., based on previous status information obtained from the backup resources, the type of components possessed by a given backup resource, or any suitable priority), a random selection process, any suitable selection method, or any combination thereof.

At block (504), the resource manager (114) obtains the status information for the selected backup resource.

In one or more embodiments of the invention, the resource manager (114) may read the status information currently stored or direct the status engine (110) to update the status information for the backup resources.

In one or more embodiments of the invention, the status information (112) may include load parameters indicative of the client load of the backup resource.

At block (506), the resource manager (114) evaluates the status information for the selected backup resource to determine the load state of the backup resource.

In one or more embodiments of the invention, the resource manager (114) may determine that a load state of the backup resource is overloaded, and in this state, the backup resource is not available for assignment. To make this determination, the resource manager (114) may compare the status information (112) to a load policy in the policy store (116) to identify if the backup resource is overloaded or the backup resource pool as a whole is overloaded. More specifically, if any backup resource is overloaded, the resource manager (114) identifies those backup resources as not being available for assignment. The resource manager (114) may temporarily disable the overloaded backup resource from receiving new clients by updating the status information for the backup resource. For instance, the resource manager (114) may set a load parameter that indicates whether the backup resource is available for servicing new clients in the status information (112). The assignment engine (118) may check this load parameter before selecting the backup resource for assignment as described herein with respect to FIG. 3.

In one or more embodiments of the invention, the status information of the backup resource pool may be evaluated based on an aggregate degree of utilization as previously discussed. The load policy may specify the load state of the backup resources as a function of an aggregate degree of utilization of the backup resources, such as a threshold for the mean or gross memory utilization of the backup resource pool. The load state of an individual backup resource may also be evaluated, but instead based on the status information available for that backup resource. The load policy may specify the load state of the backup resources as a function of the degree of utilization of a backup resource, such as a threshold for the memory utilization of the backup resource.

In one or more embodiments, the resource manager (114) determines that an aggregate load state of the backup resources is overloaded based on the status information and an aggregate load policy, and in this state, none of the backup resources are available for assignment. The resource manager (114) may make this determination in addition to or independent of determining whether a load state of an individual backup resource is overloaded.

At block (508), in response to determining that the backup resource is overloaded, the resource manager (114) may instantiate a new backup resource in the backup pool. The resource manager (114) may determine that the selected backup resource has a load state that is overloaded while an aggregate load state of the backup pool is not overloaded. The aggregate load state of the backup pool may be based on an average load state of each backup resource of the backup pool. More specifically, the resource manager (114) may take corrective action in response to an overloaded backup resource, while the average load state of the backup resources is not overloaded.

In one or more embodiments, adding the new backup resource may be performed in response to determining that the load state of a backup resource is overloaded, determining that the aggregate load state of the backup resources is overloaded, or both.

In one or more embodiments of the invention, the resource manager (114) may add a new backup resource by binding the requirements for resources, such as memory, CPU, networking, and persistent storage, to a physical instance of appropriate computing resources of a computing device, such as a physical server and operably connecting the new backup resource to the backup pool. The resource manager (114) may also determine an execution location of the new backup resource, which is not exhibiting an overloaded state, and add the new backup resource to utilize computing resources of the execution location. The execution location may be a computing device, which hosts one or more virtual instances of the backup resources. More specifically, the guest backup resources operating on a host computing device may be exhibiting an overloaded state, and the new backup resource may be added to a different host computing device. Adding may occur when the resource manager (114) selects the appropriate virtual resources (e.g., processor, memory, and persistent storage) to be hosted by a physical server. Adding may also occur by waking up a backup resource from hibernation or booting a backup resource previously configured on a computing device. In general, adding may include taking measures to operably connect a backup resource to the resource controller and a network in communication with the clients.

In one or more embodiments, the resource manager (114) may also exclude the overloaded backup resource from the process of assigning clients to available backup resources as further described herein with respect to FIG. 3. More specifically, the resource manager (114) may temporarily disable the overloaded backup resource from receiving new clients from the assignment engine (118) by updating the status information for the backup resource. For instance, the resource manager (114) may set a load parameter that indicates whether the backup resource is available for servicing new clients in the status information (112). The assignment engine (118) may check this load parameter before selecting the backup resource for assignment as further described herein with respect to FIG. 3.

The method may end following block (508).

At block (510), the resource manager (114) may also assess whether the backup resource has a load state that is underloaded based on the status information and a load policy. To efficiently manage the cost of operating the backup resource pool, the resource manager (114) may monitor for backup resources that are underloaded and remove them from the backup resource pool.

At block (512), the resource manager (114) determines that the backup resource is underloaded and removes the backup resource from the backup resource pool or any other backup resource.

In cases where the backup resource is underloaded, the backup resource may no longer be needed in the backup pool. Removing the backup resource may include migrating any clients from the underloaded backup resource to other backup resources in the backup resource pool, shutting down the backup resource, and removing the backup resource from the backup pool. Removing the backup resource may facilitate reducing the overall cost burden of operating the backup resource pool.

The method may end following block (512).

The method (500) may be repeated until all or some of the backup resources in the backup pool are evaluated. The method (500) may be performed serially or in parallel for the backup resources in the backup pool. The method (500) may be repeated after a set period of time to evaluate the client load of the backup resources. The method (500) may be triggered to run immediately after the status engine (110) updates the status information for a given backup resource.

The following is a set of example scenarios in accordance of various embodiments of the invention. The examples are not intended to limit the invention.

Example 1: Acceptable Client Load

Figure 6:
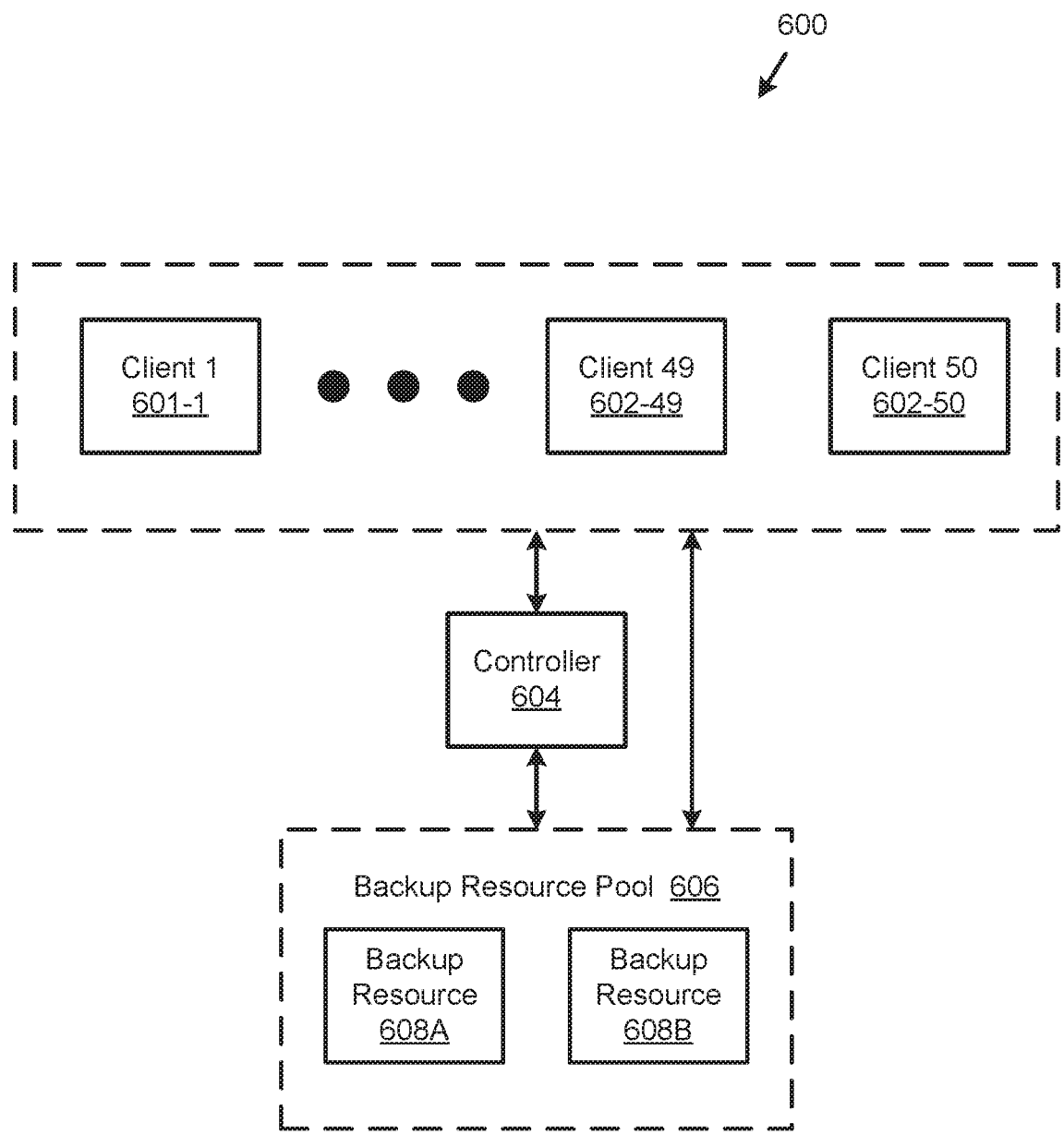
FIG. 6 shows an example of the system in compliance with a load policy in accordance with one or more embodiments of the invention.

Consider a scenario in which a client is introduced into the system, and the backup pool has an acceptable client load to assign the client to an existing backup resource. An acceptable client load refers to when none of the backup resources in the backup resource pool exhibit an overloaded state. FIG. 6 shows a diagram of the system (600) operating under such a scenario. Suppose the resource controller (604) evaluates the client load based on the first load policy in Table 2. The backup resources (608A, 608B) are providing backup services to clients (602-1-602-49), which have received backup resource assignments. As shown in Table 3 below, an additional client (602-50) is introduced into the system (600) and sends a backup resource assignment request to the resource controller (604). The resource controller (604) obtains the status information for the backup resources (608A, 608B) at the first query time. The resource controller (604) evaluates the load state of the backup resources based on the first load policy and the status information, which indicates that the backup resources (608A, 608B) comply with the first load policy of Table 2. More specifically, at the first query time of the status information, the backup resources (608A, 608B) are not overloaded according to the load policy. The resource controller (604) assigns the client (602-50) to the second backup resource (608B) by sending a backup resource assignment the backup resource (608B). The resource controller (604) obtain status information for the backup resources (608A, 608B) 60 seconds after the first query. At the second query time, the status information indicates that that the new client (602-50) has been assigned to the second backup resource (608B) and that the backup resources (608A, 608B) are still in compliance with the load policy.

Under the first load policy, none of the backup resources (608A, 608B) are identified as being overloaded by the resource controller (604). In other words, the load parameters in the status information as shown in Table 3 below do not exceed the thresholds in the first load policy of Table 2.

Therefore, the backup pool is operating at an acceptable client load, i.e., none of the backup resources are overloaded. As a result, the resource controller (604) does not instantiate an additional backup resource.

TABLE 3

Status Information

| Backup Resource | Query Time | No. of Clients | CPU Utilization | Memory Utilization |
|---|---|---|---|---|
| 608A | 1506686400 | 40 | 10% | 14% |
| 608B | 1506686400 | 9 | 20% | 25% |
| 608A | 1506686460 | 40 | 11% | 15% |
| 608B | 1506686460 | 10 | 19% | 29% |

Example 2: Overloaded Backup Resource

Figure 7:
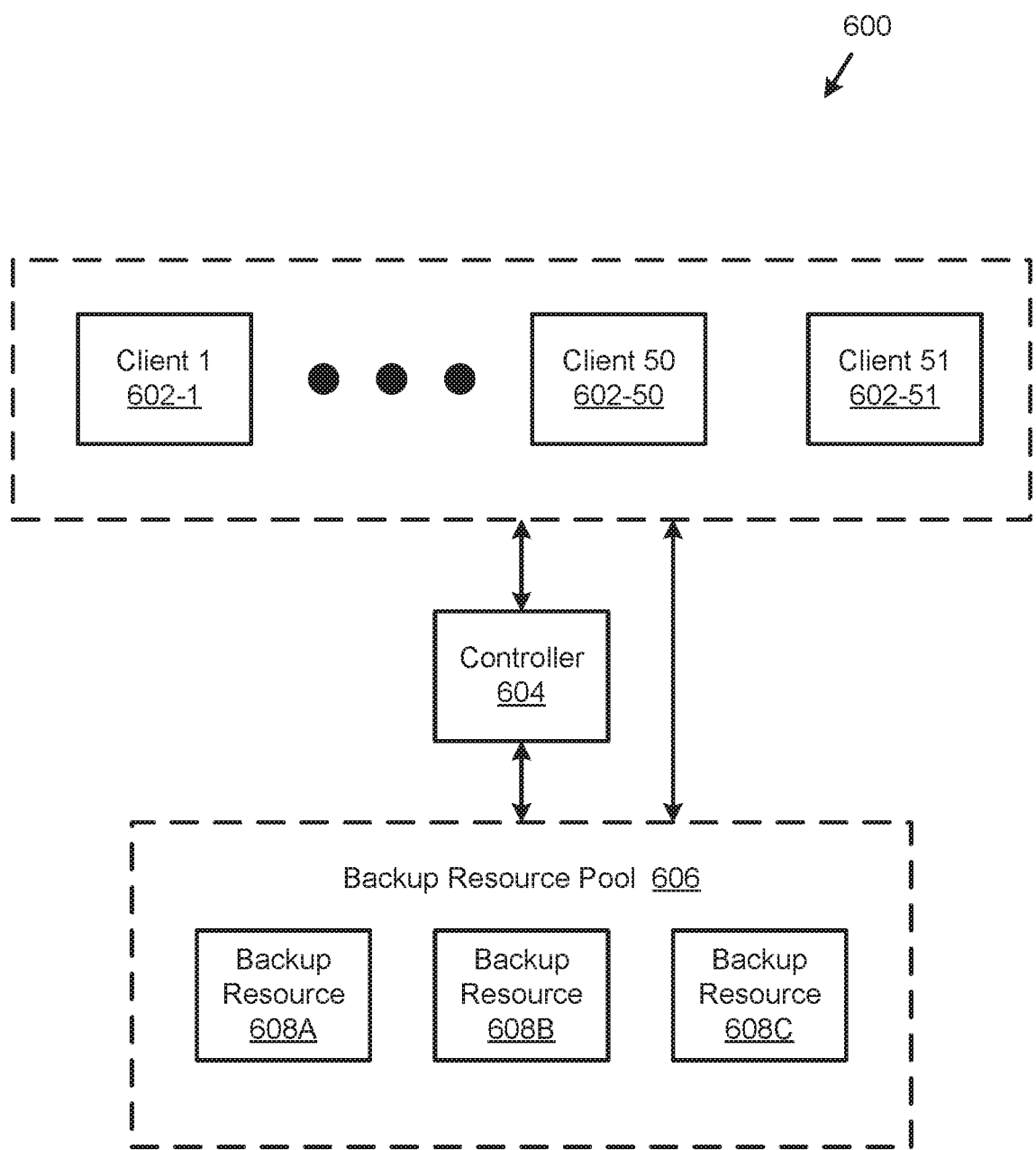
FIG. 7 shows an example of the system operating with an overloaded backup resource in accordance with one or more embodiments of the invention.

Suppose the resource controller identifies a backup resource having a load state that is overloaded according to the second load policy in Table 2. The resource controller takes corrective measures to mitigate assigning any new clients to the overloaded backup resource by instantiating an additional backup resource in the backup pool and/or disabling the overloaded backup resource from receiving new clients. FIG. 7 shows a diagram of the system 600 operating under such a scenario. The backup resources (608A, 608B) are providing backup services to clients (602-1-602-50), which have received backup resource assignments. The resource controller (604) receives obtain status information for the backup resources (608A, 608B) at the first query time. As shown in Table 4 below, the resource controller (604) obtains status information for the backup resources (608A, 608B, 608C) at separate query times separated by 60 seconds. The resource controller (604) evaluates the load state of the backup resources based on the second load policy in Table 2 and the status information collected at the first query time. At this query time, the resource controller (604) identifies the backup resource (608B) as having a load state that is overloaded. More specifically, the backup resource (608B) is identified as exceeding the load policy for memory utilization.

As a result, the resource controller (604) takes corrective measures to mitigate a newly introduced client from being assigned to the overloaded backup resource (608B). The resource controller (604) instantiates a new backup resource (608C) to the backup resource pool (606). The resource controller (604) also temporarily disables the backup resource (608B) from being available for client assignment as described herein.

TABLE 4

Status Information

| Backup Resource | Query Time | No. of Clients | CPU Utilization | Memory Utilization |
|---|---|---|---|---|
| 608A | 1506646800 | 40 | 10% | 14% |
| 608B | 1506646800 | 10 | 20% | 25% |
| 608A | 1506646860 | 40 | 11% | 15% |
| 608B | 1506646860 | 10 | 19% | 29% |
| 608C | 1506646860 | 1 | 1% | 8% |

Before the next query time, the resource controller (604) also receives an assignment request from the client (602-51) and assigns the client (602-51) to the new backup resource (608C). The status information obtained at the second query time reflects the newly added backup resource (608C) and the newly assigned client (602-51). The status information at this time also indicates that the backup resource (708B) continues to be in an overloaded state as for memory utilization with respect to the second load policy of Table 2. The backup resource (708B) may remain disabled from receiving new client assignments until the status information reflects the backup resource as not being overloaded or in compliance with the load policy under evaluation.

FIG. 8 shows a diagram of a computing device in accordance with one or more embodiments of the invention. The computing device (800) may include one or more computer processors (802), non-persistent storage (804) (e.g., volatile memory, such as random access memory (RAM), cache memory), persistent storage (806) (e.g., a hard disk, an optical drive such as a compact disk (CD) drive or digital versatile disk (DVD) drive, a flash memory, etc.), a communication interface (812) (e.g., Bluetooth interface, infrared interface, network interface, optical interface, etc.), input devices (810), output devices (808), and numerous other elements (not shown) and functionalities. Each of these components is described below.

In one embodiment of the invention, the computer processor(s) (802) may be an integrated circuit for processing instructions. For example, the computer processor(s) may be one or more cores or micro-cores of a processor. The computing device (800) may also include one or more input devices (810), such as a touchscreen, keyboard, mouse, microphone, touchpad, electronic pen, or any other type of input device. Further, the communication interface (812) may include an integrated circuit for connecting the computing device (800) to a network (not shown) (e.g., a local area network (LAN), a wide area network (WAN) such as the Internet, mobile network, or any other type of network) and/or to another device, such as another computing device.

In one embodiment of the invention, the computing device (800) may include one or more output devices (808), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (802), non-persistent storage (804), and persistent storage (806). Many different types of computing devices exist, and the aforementioned input and output device(s) may take other forms.

Embodiments of the invention enable load balancing of the backup resources in a backup pool. As used herein, load balancing the backup resources refers to taking corrective measures in response to identifying an overloaded or underloaded backup resource. This is advantageous to reducing the load of the backup resources, which may perform data deduplication, data compression, and incremental backups while providing data storage and/or backup services to the clients. For systems that perform data deduplication, clients cannot be easily migrated from one backup resource to another because the deduplication must be performed against previously stored data. To provide a highly responsive service to the clients, it is critical for the backup resource pool to be responsive in mitigating an overloaded backup resource. The load balancing described herein may improve the performance of the interaction between the clients and the backup resources. More specifically, the backup resources may respond to a load state where a backup resource is overloaded by adding a backup resource to the backup pool. This results in the system having more backup resources to take on new clients and mitigating a situation where the all the backup resources are overloaded to the detriment of the clients.

The resource controller may also respond to a backup resource being underloaded by removing that backup resource from the backup pool. This may result in reducing the cost of operating the backup pool including costs associated with providing maintenance, support, and availability of the underloaded backup resource.

Embodiments of the invention also enable instantiating an additional backup resource in situations where the aggregate load of the backup resource pool may not be in an overloaded state. This results in an anticipatory process that seeks to prevent too many of the backup resources from becoming overloaded. Providing such a fine threshold allows the system to respond to an overloaded backup resource before any other backup resources exhibit a similar client load.

One or more embodiments of the invention may be implemented using instructions executed by one or more processors in the system. Further, such instructions may corresponds to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for load balancing backup resources of a backup resource pool, the method comprising:
    obtaining status information for a plurality of backup resources of the backup resource pool, wherein the backup resources of the backup resource pool continuously provide resource intensive computer implemented services to clients;
    while an aggregate load state of the backup resource pool is not overloaded, making a first determination that a first backup resource of the plurality of backup resources of the backup resource pool has a load state that is overloaded based on the status information and a load policy;
    in response to the first determination, adding a new backup resource to the backup resource pool;
    after adding the new backup resource, updating the status information for the plurality of backup resources of the backup resource pool;
    while the aggregate load state of the backup resource pool is underloaded, making a second determination that the first backup resource of the plurality of backup resources has a second load state that is underloaded based on the status information and the load policy; and
    in response to the second determination, removing the new backup resource from the resource backup pool.

2. The method of claim 1, wherein the aggregate load state of the backup resource pool is based on an average load state of each backup resource of the backup resource pool that is providing the resource intensive computer implemented services.

3. The method of claim 1, further comprising, after adding the new backup resource, obtaining updated status information from the first backup resource.

4. The method of claim 1, further comprising:
    in response to the second determination, removing the first backup resource of the plurality of backup resources from the backup resource pool.

5. The method of claim 1, further comprising in response to the first determination, disabling the first backup resource from being assigned to a new client.

6. The method of claim 1, wherein the first backup resource of the plurality of backup resources comprises a server.

7. The method of claim 1, wherein the first backup resource of the plurality of backup resources is a virtual resource hosted on a physical server.

8. The method of claim 1, wherein the load policy specifies the load state of the first backup resource of the plurality of backup resources as a function of a degree of utilization of the first backup resource of the plurality of backup resources.

9. The method of claim 8, wherein the function specifies that the load state of the first backup resource of the plurality of backup resources is overloaded when the degree of utilization of the first backup resource of the plurality of backup resources exceeds a threshold.

10. The method of claim 1, wherein the status information specifies a rate of use of a computing resource of the first backup resource of the plurality of backup resources; a concurrency of use of the first backup resource of the plurality of backup resources; and a condition of the first backup resource of the plurality of backup resources.

11. The method of claim 10, wherein the computing resource is one selected from a group consisting of processor cycles, transitory memory space, network communication bandwidth, and disk input-output.

12. The method of claim 1, wherein the status information specifies a concurrency of use of the first backup resource of the plurality of backup resources.

13. The method of claim 12, wherein the concurrency of use is based on one selected from a group consisting of a cardinality of a plurality of the clients that utilize the first backup resource of the plurality of backup resources and a cardinality of a plurality of processes executing on the first backup resource of the plurality of backup resources.

14. The method of claim 1, wherein the status information specifies a condition of the first backup resource of the plurality of backup resources.

15. The method of claim 14, wherein the condition is one selected from a group consisting of a power consumption of the first backup resource of the plurality of backup resources and a temperature of a component of the first backup resource of the plurality of backup resources.

16. A non-transitory computer readable medium comprising computer readable program code, which when executed by a computer processor enables the computer processor to perform a method for load balancing backup resources of a backup resource pool, the method comprising:
    obtaining status information for a plurality of backup resources of the backup resource pool, wherein the backup resources of the backup resource pool continuously provide resource intensive computer implemented services to clients;
    while an aggregate load state of the backup resource pool is not overloaded, making a determination that a first backup resource of the plurality of backup resources of the backup resource pool has a load state that is overloaded based on the status information and a load policy;
    in response to the determination, adding a new backup resource to the backup resource pool;

after adding the new backup resource, updating the status information for the plurality of backup resources of the backup resource pool;

while the aggregate load state of the backup resource pool is underloaded, making a second determination that the first backup resource of the plurality of backup resources has a second load state that is underloaded based on the status information and the load policy; and in response to the second determination, removing the new backup resource from the backup resource pool.

17. The non-transitory computer readable medium of claim 16, wherein:

the aggregate load state of the backup resource pool is based on an average load state of each backup resource of the backup resource pool that is providing the resource intensive computer implemented services; and the load policy specifies the load state of the first backup resource of the plurality of backup resources as a function of a degree of utilization of the first backup resource of the plurality of backup resources.

18. A system, comprising:

a client;

a backup resource pool comprising a plurality of backup resources;

a resource controller in communication with the client and the backup resource pool, wherein the resource controller comprises a processor operable to:

obtain status information for the plurality of backup resources of the backup resource pool, wherein the backup resources of the backup resource pool continuously provide resource intensive computer implemented services to, at least, the client;

while an aggregate load state of the backup resource pool is not overloaded, make a determination that a first backup resource of the plurality of backup resources of the backup resource pool has a load state that is overloaded based on the status information and a load policy;

in response to the determination, add a new backup resource to the backup resource pool;

after adding the new backup resource, updating the status information for the plurality of backup resources of the backup resource pool;

while the aggregate load state of the backup resource pool is underloaded, making a second determination that the first backup resource of the plurality of backup resources has a second load state that is underloaded based on the status information and the load policy; and in response to the second determination, removing the new backup resource from the backup resource pool.

19. The system of claim 18, wherein:

the aggregate load state of the backup resource pool is based on an average load state of each backup resource of the backup resource pool that is providing the resource intensive computer implemented services; and the load policy specifies the load state of the first backup resource of the plurality of backup resources as a function of a degree of utilization of the first backup resource of the plurality of backup resources based on the status information.

* * * * *